United States Patent
Sun et al.

(10) Patent No.: US 10,802,393 B2
(45) Date of Patent: Oct. 13, 2020

(54) EXTREME ULTRAVIOLET (EUV) LITHOGRAPHY MASK

(71) Applicant: GLOBALFOUNDRIES INC., Grand Cayman (KY)

(72) Inventors: Lei Sun, Altamont, NY (US); Obert R. Wood, II, New York, NY (US); Genevieve Beique, Clifton Park, NY (US); Yulu Chen, West Sand Lake, NY (US); Erik Verduijn, Leuven (BE); Francis Goodwin, Halfmoon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 179 days.

(21) Appl. No.: 15/784,408

(22) Filed: Oct. 16, 2017

(65) Prior Publication Data
US 2019/0113836 A1   Apr. 18, 2019

(51) Int. Cl.
*G03F 1/24* (2012.01)
*G03F 1/58* (2012.01)
*G03F 1/80* (2012.01)

(52) U.S. Cl.
CPC .............. *G03F 1/24* (2013.01); *G03F 1/58* (2013.01); *G03F 1/80* (2013.01)

(58) Field of Classification Search
CPC ............... G03F 7/20; G03F 1/24; G03F 1/22
See application file for complete search history.

(56) References Cited

U.S. PATENT DOCUMENTS

| | | | |
|---|---|---|---|
| 9,195,132 B2 | 11/2015 | Patil et al. | |
| 9,513,557 B2* | 12/2016 | Yamazaki | G03F 7/70033 |
| 2002/0045108 A1* | 4/2002 | Lee | G03F 1/24 430/5 |
| 2003/0198874 A1* | 10/2003 | Lee | B82Y 10/00 430/5 |
| 2005/0106474 A1* | 5/2005 | Kindt | C25D 5/022 430/5 |
| 2007/0160874 A1* | 7/2007 | Hayashi | B82Y 10/00 430/5 |

(Continued)

FOREIGN PATENT DOCUMENTS

| | | | |
|---|---|---|---|
| DE | 102014222028 | 7/2015 | |
| JP | 2007-035931 | * 2/2007 | G03F 1/16 |

(Continued)

OTHER PUBLICATIONS

Rastegar et al., "Study of alternative capping and absorber layers for extreme ultraviolet (EUV) masks for sub-16 nm half-pitch nodes", Proc. SPIE vol. 9048 articles 90480L (11 pages) (2014).*

(Continued)

*Primary Examiner* — Martin J Angebranndt
(74) *Attorney, Agent, or Firm* — Michael Le Strange; Andrew M. Calderon; Roberts Calderon Safran & Cole, P.C.

(57) ABSTRACT

The present disclosure relates to semiconductor structures and, more particularly, to an extreme ultraviolet (EUV) lithography mask and methods of manufacture. The EUV mask structure includes: a reflective layer; a capping material on the reflective layer; a buffer layer on the capping layer; alternating absorber layers on the buffer layer; and a capping layer on the top of the alternating absorber layers.

19 Claims, 2 Drawing Sheets

(56) References Cited

U.S. PATENT DOCUMENTS

| | | | | |
|---|---|---|---|---|
| 2008/0070128 | A1* | 3/2008 | Wu | B82Y 10/00 430/5 |
| 2010/0266938 | A1* | 10/2010 | Hosoya | B82Y 10/00 430/5 |
| 2011/0253208 | A1* | 10/2011 | Ohmi | H01L 31/022466 136/255 |
| 2013/0164660 | A1* | 6/2013 | Hayashi | G03F 1/24 430/5 |
| 2014/0254001 | A1* | 9/2014 | Sun | G02B 5/283 359/360 |
| 2014/0254018 | A1* | 9/2014 | Sun | G02B 5/208 359/599 |
| 2014/0363633 | A1* | 12/2014 | Kim | G03F 1/72 428/195.1 |
| 2015/0140477 | A1* | 5/2015 | Singh | G03F 7/2004 430/5 |
| 2016/0011500 | A1* | 1/2016 | Hassan | G03F 1/22 430/5 |
| 2016/0109384 | A1* | 4/2016 | Nakanishi | G01N 21/8851 430/5 |
| 2016/0116836 | A1* | 4/2016 | Kim | G03F 1/82 430/5 |
| 2017/0038673 | A1* | 2/2017 | Ikebe | G03F 1/26 |
| 2017/0108766 | A1* | 4/2017 | Bender | G03F 1/38 |
| 2018/0031964 | A1* | 2/2018 | Jindal | G03F 1/58 |
| 2018/0031965 | A1* | 2/2018 | Jindal | G03F 1/54 |
| 2019/0146325 | A1* | 5/2019 | Hsueh | G03F 1/52 430/5 |

FOREIGN PATENT DOCUMENTS

| | | |
|---|---|---|
| TW | 201327669 | 7/2013 |
| TW | 201518855 | 5/2015 |
| TW | 201706708 | 2/2017 |
| WO | 2018022372 | 2/2018 |

OTHER PUBLICATIONS

Taiwanese Office Action and Search Report in related TW Application No. 10720831560 dated Sep. 11, 2018, 8 pages.
German Office Action in related DE Application No. 10 2017 222 103.8 dated Jun. 7, 2018, 4 pages.
Taiwanese Office Action and Search Report in related TW Application No. 107102967 dated Apr. 23, 2020, 9 pages.
Taiwanese Office Action and Search Report in related TW Application No. 107102967 dated May 22, 2019, 6 pages.

* cited by examiner

EXTREME ULTRAVIOLET (EUV) LITHOGRAPHY MASK

FIELD OF THE INVENTION

The present disclosure relates to semiconductor structures and, more particularly, to an extreme ultraviolet (EUV) lithography mask and methods of manufacture.

BACKGROUND

Extreme ultraviolet lithography (EUV) is a next-generation lithography technology using an extreme ultraviolet (EUV) wavelength, e.g., 13.5 nm. More specifically, lithographic patterning to pattern smaller technology nodes will require EUV lithography for many of the critical levels. Because all optical elements in the EUV scanner must be reflective, an EUV photomask must be illuminated at an angle to its normal. The non-orthogonal illumination of the EUV mask causes: (i) shadowing of lines that are perpendicular to the incident beam; (ii) the appearance of telecentricity errors which result in a pattern shift through focus; and (iii) image contrast loss due to apodization by the reflective multilayer coating in mask.

An EUV reflective mask consists of a patterned absorber (e.g. TaN, TaBN) deposited over a capped multilayer reflector (e.g. Mo/Si). The patterned absorber needs to be very thick to keep the EUV reflectance at or below ~2%, needed for high image contrast. The minimum thickness of conventionally based absorbers is 50 to 70 nm. This thickness, though, adds to the shadowing effect, particularly when the light beam is directed to the reflector at an incident angle of about 6 degrees from normal.

SUMMARY

In an aspect of the disclosure, an extreme ultraviolet mask structure comprises: a reflective layer; a capping material on the capping layer; a buffer layer on the reflective layer; alternating absorber layers on the buffer layer; and a capping layer on the top of the alternating absorber layers.

In an aspect of the disclosure, an extreme ultraviolet mask structure comprises: a multilayer reflective layer of Mo/Si; a capping material directly on the multilayer reflective layer; a buffer layer directly on the capping material; alternating absorber layers of Ni based material and Ta based material on the buffer layer; and a capping layer on the top of the alternating absorber layers.

In an aspect of the disclosure, a method comprises: forming a capping material directly on a reflective layer; forming a buffer layer directly on the reflective layer; forming alternating absorber layers of Ni based material and Ta based material on the buffer layer; forming a resist on an uppermost Ta based absorber layer; and selectively etching the buffer layer and alternating absorber layers to form a pattern.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an extreme ultraviolet (EUV) lithography mask and methods of manufacture. More specifically, the present disclosure is directed to an EUV mask with a thin absorber layer and a buffer layer, which provides a highly absorbing patterned absorber on the mask (compared to conventional systems). Advantageously, the EUV mask disclosed herein dramatically reduces the severity of EUV-specific issues including, e.g., shadowing effects.

The EUV mask of the present disclosure can be manufactured in a number of ways using a number of different tools. In general, though, the methodologies and tools are used to form structures with dimensions in the micrometer and nanometer scale. The methodologies, i.e., technologies, employed to manufacture the EUV mask of the present disclosure have been adopted from integrated circuit (IC) technology. For example, the structures are built on wafers and are realized in films of material patterned by photolithographic processes on the top of a wafer. In particular, the fabrication of the EUV mask uses three basic building blocks: (i) deposition of thin films of material on a substrate, (ii) applying a patterned mask on top of the films by photolithographic imaging, and (iii) etching the films selectively to the mask.

Figure 1:
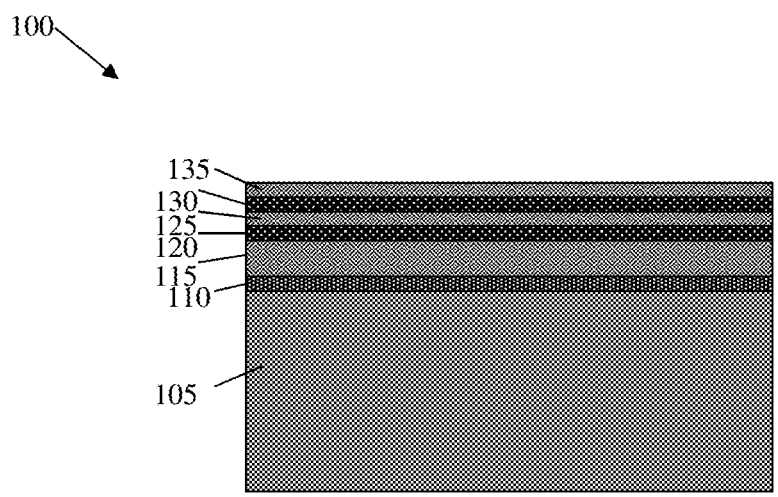
FIG. 1 shows an EUV mask and respective fabrication processes in accordance with aspects of the present disclosure.

FIG. 1 shows an EUV mask and respective fabrication processes in accordance with aspects of the present disclosure. In embodiments, the EUV mask 100 includes a capping layer 110 deposited over a reflective base layer 105. In embodiments, the capping layer 110 is a Ru capping layer deposited by conventional deposition processes, e.g., chemical vapor deposition (CVD) process. The reflective base layer 105 can be Mo/Si with a reflective coating thereon.

Still referring to FIG. 1, a buffer layer 115 is deposited on the capping layer 110. In embodiments, the buffer layer 115 is TaN, as an example, which can be deposited to a thickness of about 1 nm to 20 nm by a conventional deposition method, e.g., CVD. The buffer layer 115 can also be other absorber materials, which will lie between the Ru capping layer 110 and a subsequently formed absorber layer, e.g., Ni layer 120. In embodiments, the buffer layer 115 can be other Ta based materials, e.g., TaBN, any of which are used to protect the underlying reflective base layer 105 during a subsequent etching process.

In embodiments, alternating absorber layers of Ni based material and Ta based materials are deposited on the buffer layer 115 using conventional deposition methods, e.g., CVD. For example, Ni layer 120 is deposited on the buffer layer 115, followed by TaN layer 125, Ni layer 130 and TaN layer 135, e.g., capping layer. It should be understood by those of skill in the art that there can be more or less layers of the alternating absorber materials, e.g., 1 to 10 pairs. Also, in embodiments, each of the layers 120, 125, 130, 135 can be deposited to a thickness of about 1 nm to 10 nm and preferably between 2 nm to 4 nm. In embodiments, a total thickness of the layers 115, 120, 125, 130, 135 can range from about 25 nm to 45 nm or less, and more preferably e.g., 15 nm to 40 nm, which will provide an effective absorption for the EUV mask 100. Also, in embodiments, the thickness of the Ni layers 120, 130 will prevent crystallization of the Ni material and also allows film stress to be controlled.

Figure 2:
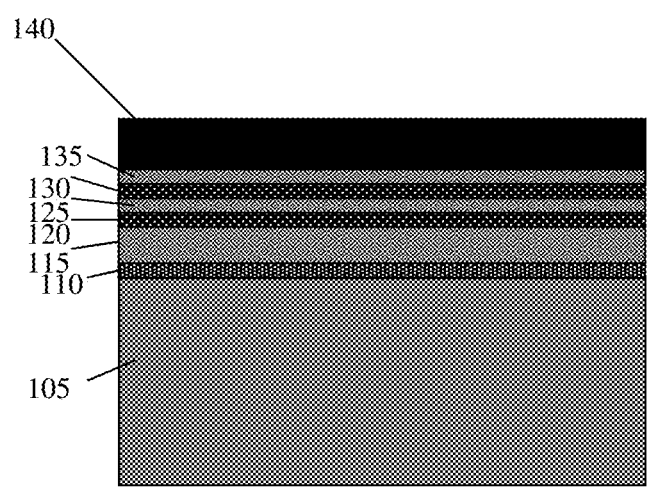
FIG. 2 shows the EUV mask with a resist layer and respective fabrication processes in accordance with aspects of the present disclosure.

As further shown in FIG. 2, a resist material 140 is deposited on the upper capping layer 135. In embodiments, the resist material 140 can be a stack of known resist materials including, e.g., hardmask materials and anti-reflective coatings. The upper capping layer 135 will prevent nickel diffusion into the resist layer 140 from the Ni layer 130 (e.g., upper most Ni layer). As should be understood by those of skill in the art, Ni can diffuse into resist and prevent resist being washed away.

Figure 3:
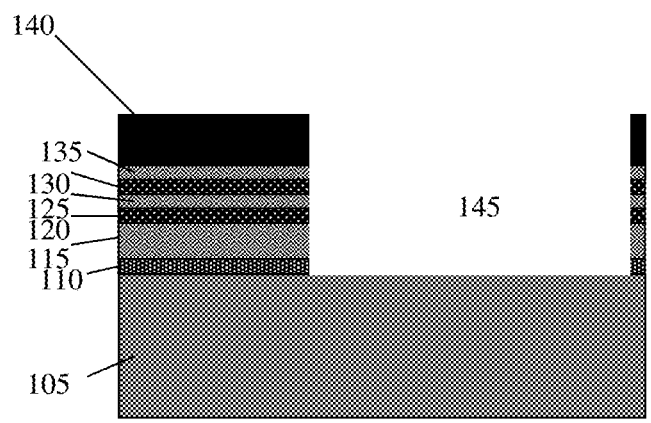
FIG. 3 shows a patterned EUV mask and respective fabrication processes in accordance with aspects of the present disclosure.

FIG. 3 shows a patterned mask and respective fabrication processes in accordance with aspects of the present disclosure. In embodiments, the resist layer 140 formed over the upper capping layer 135 is exposed to energy (light) to form a pattern (opening). An etching process with a selective chemistry, e.g., reactive ion etching (RIE), will be used to form one or more patterns 145 in the absorber layers 120, 125, 130, 135 and buffer layer 115. In embodiments, a chemistry of F or $CL_2$ can be used to pattern (etch) the Ta based materials, e.g., layers 115, 125 and 135; whereas, a more aggressive chemistry of $CH_4$ is used to pattern (etch) the Ni based materials, e.g., layers 120, 130. It should be recognized by those of skill in the art that the buffer layer 115 will protect the underlying layers 105, 110 during the more aggressive Ni etching. In this way, the reflective base layer 105 will not be damaged during the patterning of the absorber layers, e.g., Ni layer 120. Following the patterning, the resist 140 can then be removed by a conventional oxygen ashing process or other known stripants.

Figure 4:
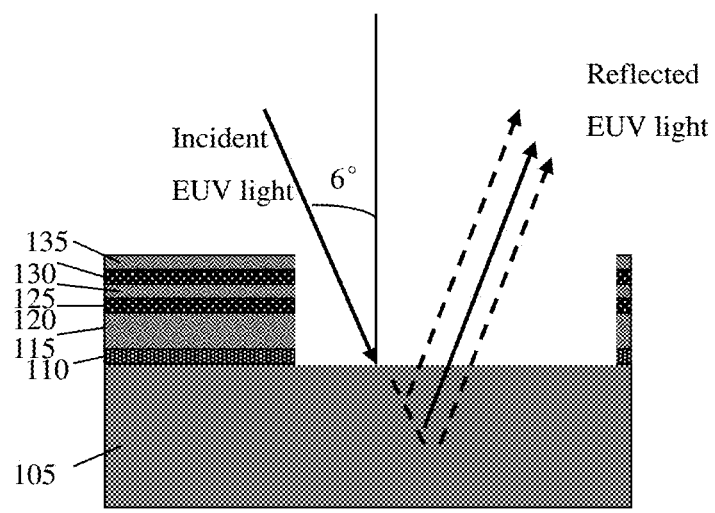
FIG. 4 shows an EUV mask with incident light reflecting from the reflective surface in accordance with aspects of the present disclosure.

FIG. 4 shows an EUV mask with incident light reflecting from the reflective surface in accordance with aspects of the present disclosure. As shown in this representation, an incident EUV light of 6° will reflect from the surface of the layer 105, with less shadowing effects caused by absorption from the reduced height of absorber layers 120, 125, 130, 135. In this way, the EUV mask 100 will reduce the severity of EUV-specific issues including, e.g., shadowing effects and contrast loss.

The mask fabricated from the method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An extreme ultraviolet mask structure, comprising:
a reflective layer;
a capping material layer on the reflective layer;
a buffer layer on the capping material layer, the buffer layer being a TaBN;
alternating absorber layers over the buffer layer and the reflective layer, wherein the alternating absorber layers are arranged so that a first Ni based absorber layer of the alternating absorber layers is on the buffer layer, a second Ni based absorber layer of the alternating absorber layers is a top layer of the alternating absorber layers, and a Ta based absorber layer is located between the first Ni based absorber layer and the second Ni based absorber layer;
a capping layer of Ta based material on the second Ni based absorber layer on the top of the alternating absorber layers; and
one or more patterns in the capping material layer, the buffer layer, the alternating absorber layers and the capping layer, which expose a top surface of the reflective layer,
wherein a total thickness of the alternating absorber layers and the TaBN buffer layer is set to provide minimal shadowing for incident extreme ultraviolet (EUV) light at angles between 0°-6°.

2. The extreme ultraviolet mask structure of claim 1, wherein the reflective layer is Mo/Si and the capping material layer is Ru.

3. The extreme ultraviolet mask structure of claim 1, wherein each absorber layer of the alternating absorber layers has a thickness less than that of the buffer layer.

4. The extreme ultraviolet mask structure of claim 1, wherein the alternating absorber layers include additional Ni and Ta based absorber layers interposed between the first Ni based absorber layer and the second Ni based absorber layer.

5. The extreme ultraviolet mask structure of claim 1, wherein:
the first Ni based absorber layer is deposited directly on the buffer layer;
the buffer layer is deposited directly on the capping material layer;
side surfaces of the capping material layer, the buffer layer, the alternating absorber layers and the capping layer are exposed by the one or more patterns;
the EUV light is 13.5 nm light;
the reflective layer is Mo/Si and the capping material layer is Ru;
each absorber layer of the alternating absorber layers has a thickness less than that of the buffer layer;
the alternating absorber layers include additional Ni and Ta based absorber layers interposed between the first Ni based absorber layer and the second Ni based absorber layer;
each of the alternating absorber layers each have a thickness of about 1 nm to 4 nm;
the capping layer is directly on a Ni based material of the alternating absorber layers; and
the total thickness of the alternating absorber layers and the buffer layer is about 15 nm to about 40 nm.

6. The extreme ultraviolet mask structure of claim 1, wherein each of the alternating absorber layers have a thickness of about 1 nm to 10 nm.

7. The extreme ultraviolet mask structure of claim 6, wherein each of the alternating absorber layers each have a thickness of about 2 nm to 4 nm, which is less than a thickness of the buffer layer, and the capping layer is directly on a Ni based material of the alternating absorber layers.

8. An extreme ultraviolet mask structure comprising:
a reflective multilayer layer of Mo/Si;
a capping material layer directly on the multilayer reflective layer;
a buffer layer directly on the capping material layer, the buffer layer being a TaBN;
alternating absorber layers of Ni based material and Ta based material over the buffer layer and the reflective multilayer layer, wherein the alternating absorber layers are arranged so that a first Ni based absorber layer of the alternating absorber layers is on the buffer layer, a second Ni based absorber layer of the alternating absorber layers is a top layer of the alternating absorber layers, and a Ta based absorber layer is located between the first Ni based absorber layer and the second Ni based absorber layer;
a capping layer of Ta based material on the second Ni based absorber layer on the top of the alternating absorber layers; and
a patterned opening in the capping material layer, the buffer layer, the alternating absorber layers of Ni based material and Ta based material and the capping layer, which exposes a top surface of the reflective multilayer layer and side surfaces of the capping material layer, the buffer layer, the alternating absorber layers of Ni based material and Ta based material and the capping layer,
wherein a total thickness of the alternating absorber layers and the buffer layer is about 25 nm to about 45 nm to provide minimal shadowing for incident extreme ultraviolet (EUV) light at angles between 0°-6° while providing EUV reflectance of 2% or less from areas covered by the alternating absorber layers.

9. The extreme ultraviolet mask structure of claim 8, wherein the capping material layer is Ru.

10. The extreme ultraviolet mask structure of claim 8, wherein each absorber layer of the Ni based material has a thickness less than that of the buffer layer.

11. The extreme ultraviolet mask structure of claim 8, wherein the alternating absorber layers include additional Ta-based absorber layers alternating with additional Ni based absorber layers interposed between the first Ni based absorber layer and the second Ni based absorber layer.

12. The extreme ultraviolet mask structure of claim 11, wherein first Ni based absorber layer is deposited directly on the buffer layer.

13. The extreme ultraviolet mask structure of claim 8, wherein each of the alternating absorber layers have a thickness of about 1 nm to 10 nm.

14. The extreme ultraviolet mask structure of claim 13, wherein each of the alternating absorber layers each have a thickness of about 2 nm to 4 nm.

15. The extreme ultraviolet mask structure of claim 14, wherein the alternating absorber layers include paired layers.

16. The extreme ultraviolet mask structure of claim 14, wherein:
a total thickness of the alternating absorber layers and the buffer layer is about 15 nm to about 40 nm;
the EUV light is 13.5 nm light;
the reflective layer is Mo/Si and the capping material layer is Ru;
each absorber layer of the alternating absorber layers has a thickness less than that of the buffer layer;
the alternating absorber layers include additional Ni and Ta based absorber layers interposed between the first Ni based absorber layer and the second Ni based absorber layer;
each of the alternating absorber layers each have a thickness of about 1 nm to 4 nm;
the capping layer is directly on a Ni based material of the alternating absorber layers.

17. A method comprising:
forming a capping material layer directly on a reflective layer;
forming a buffer layer directly on the capping material layer, the buffer layer being a TaBN;
forming alternating absorber layers of Ni based material and Ta based material on the buffer layer, wherein the alternating absorber layers are arranged so that a first Ni based absorber layer of the alternating absorber layers is on the buffer layer, a second Ni based absorber layer of the alternating absorber layers is a top layer of the alternating absorber layers, and a Ta based absorber layer is located between the first Ni based absorber layer and the second Ni based absorber layer;
forming a capping layer of Ta based material on the second Ni based absorber layer on top of the alternating absorber layers;
forming a resist on a capping layer of Ta based material over the reflective layer and the buffer layer; and
selectively etching the buffer layer with a chemistry of F and etching the alternating absorber layers with a chemistry of $CH_4$ for the Ni based material and with a chemistry of $Cl_2$ for the Ta based material to form a pattern exposing a top surface of the reflective layer and side surfaces of the capping material layer, the buffer layer, the alternating absorber layers of Ni based material and Ta based material and the Ta based capping layer,
wherein a total thickness of the alternating absorber layers and the buffer layer is set to provide minimal shadowing for incident extreme ultraviolet (EUV) light at angles between 0°-6° while providing EUV reflectance of 2% or less from areas covered by the alternating absorber layers.

18. The method of claim 17, wherein the Ta based capping layer prevents Ni diffusion from the second Ni based absorber layer at the top of the alternating absorber layers into the resist, and each absorber layer of the Ni based material has a thickness less than that of the buffer layer.

19. The method of claim 18, wherein:
the buffer layer protects the reflective layer during a selective etching of the alternating absorber layers of Ni;
the EUV light is 13.5 nm light;
the reflective layer is Mo/Si and the capping material layer is Ru;
each absorber layer of the alternating absorber layers has a thickness less than that of the buffer layer;
the alternating absorber layers include additional Ni and Ta based absorber layers interposed between the first Ni based absorber layer and the second Ni based absorber layer;
each of the alternating absorber layers each have a thickness of about 1 nm to 4 nm;

the capping layer is directly on a Ni based material of the alternating absorber layers; and the total thickness of the alternating absorber layers and the buffer layer is about 15 nm to about 40 nm.

* * * * *